(12) United States Patent
Rahman et al.

(10) Patent No.: US 7,148,749 B2
(45) Date of Patent: Dec. 12, 2006

(54) CLOSED LOOP POWER CONTROL WITH HIGH DYNAMIC RANGE

(75) Inventors: Mahibur Rahman, Lake Worth, FL (US); Jorge Ivonnet, Lake Worth, FL (US); Pravinkumar Premakanthan, Delray Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 154 days.

(21) Appl. No.: 11/046,910

(22) Filed: Jan. 31, 2005

(65) Prior Publication Data

US 2006/0170499 A1  Aug. 3, 2006

(51) Int. Cl.
*H03G 3/10* (2006.01)

(52) U.S. Cl. ...................... 330/279; 330/291
(58) Field of Classification Search ............. 330/279, 330/285, 291, 296
See application file for complete search history.

(56) References Cited

U.S. PATENT DOCUMENTS

| | | | |
|---|---|---|---|
| 5,150,075 A | 9/1992 | Heietala et al. | |
| 5,278,994 A | 1/1994 | Black et al. | |
| 6,057,732 A * | 5/2000 | Morishita | 330/129 |
| 6,160,449 A | 12/2000 | Klomsdorf et al. | |
| 6,417,730 B1 * | 7/2002 | Segallis et al. | 330/129 |
| 2004/0137852 A1 | 7/2004 | Shi et al. | |
| 2004/0166885 A1 | 8/2004 | Mohsen et al. | |

* cited by examiner

*Primary Examiner*—Henry Choe
(74) *Attorney, Agent, or Firm*—Charles W. Bethards (57) ABSTRACT

A method (500) and apparatus (300, 400, 601) facilitate closed loop transmit power control in a power control loop at and during a transition from one transmit power level to another transmit power level in a transmitter. The apparatus includes a reference path (326) configured to provide a reference signal (325) and a gain compensation signal (417), a detect path (327) configured to process, in accordance with the gain compensation signal, a detected signal corresponding to a power level to provide a gain compensated detected signal; and a power control path (328) configured to generate a power control value in accordance with the reference signal, the gain compensated detected signal, and a loop compensation factor associated with the gain compensation signal where the power control value is suitable for setting the power level for the transmission.

20 Claims, 7 Drawing Sheets

CLOSED LOOP POWER CONTROL WITH HIGH DYNAMIC RANGE

FIELD OF THE INVENTION

The present invention relates in general to wireless communication systems, and more specifically to a method and apparatus for performing power control in a wireless transmitter.

BACKGROUND OF THE INVENTION

Power control of the transmission signal is a critical performance and efficiency aspect in wireless communication systems and associated networks such as Global System Mobile (GSM), Enhanced Data rate for GSM Evolution (EDGE), Wideband Code Division Multiple Access (WCDMA), High Speed Downlink Packet Access (HSDPA) systems and the like. In order to meet rigid specifications for transmission in such environments including transmission power vs. time masks, frequency domain transmission power emission masks, and the like, particularly over a variety of temperature ranges, power supply voltage ranges, and the like, precise transmit power control must be achieved, most often with closed loop power control.

A target power level associated with a transmission may be achieved, given transmit RF/IF path gain variations, using closed loop control. Closed loop control is often used to achieve the Power versus Time masks and transient Adjacent Channel Power (ACP) levels in accordance with the relevant specifications, as well as to perform power amplifier (PA) load switching to improve PA efficiency. Using the basic elements of a modern closed loop power control system including one or more of baseband gain control, Intermediate Frequency (IF) gain control, Radio Frequency (RF) gain control, and the like, the transmit power gain of RF stages such as the RF Voltage Controlled Amplifier (VCA) and the RF PA can be adjusted to meet demands. An RF power detector and an A/D converter facilitate digital closed loop power control where a detected digital signal power level is compared to a pre-programmed reference signal to generate an error signal. A loop filter controls the loop dynamics of the control system by filtering the error signal and providing a control output which is converted and used to control the transmit power level through, for example, the VCA and PA power control stages.

Limitations in conventional transmit power control systems arise where, for example, the transmitted power has a higher dynamic range than the A/D converter. As a result, the closed loop power control range is limited leading to performance degradation such as loss of power accuracy, failure to meet Power versus Time masks, unacceptable transient ACP, and the like. Further, PA efficiency can be reduced due to current drain resulting from the loss of load switching capability in the PA across the lost converter range. Further limitations occur during transmit power transitions associated with switching from a power level associated with, for example, a first slot, to a power level associated with a second slot. The transitions require a ramp-up or ramp-down depending on the next power level and poor power control during such intervals can cause disturbances in the loop bandwidth ultimately increasing convergence or settling time for new gain levels. Transmit power transients and the like during ramp or transition intervals may further cause a transmitter to exceed power masks and result in instability at least for a period of time until a post transition gain level settles.

BRIEF DESCRIPTION OF THE DRAWINGS

The accompanying figures where like reference numerals refer to identical or functionally similar elements and which together with the detailed description below are incorporated in and form part of the specification, serve to further illustrate various exemplary embodiments and to explain various principles and advantages in accordance with the present invention.

DETAILED DESCRIPTION

In overview, the present invention relates to transmit power control in wireless communication systems for facilitating communications between devices or units, often referred to as communication units, such as cellular telephones or two-way radio handsets and the like. The present invention can be implemented in a mixed signal power control system architecture providing a detect path dynamic range much greater than that of, for example, a feedback A/D converter to resolve disadvantages present in many conventional systems. The increase in the detect path A/D range is achieved automatically by the mixed signal architecture without requiring special factory phasing steps or special software setup by an external host processor or the like thereby resulting in reduced production costs. Further advantages associated with power control in accordance with various exemplary embodiments include the elimination of software setup timing issues occurring prior to each power transition—a known problem in, for example, present 3G power control systems, and the ability to perform power transition from a present power level to a new power level for transitions such as slot-to-slot power transitions.

More particularly, various inventive concepts and principles are embodied in cellular communication systems, infrastructure components, or communication units or devices, and more specifically transmitter systems, integrated circuits, and methods therein for performing closed loop transmit power control. It should be noted that in addition to connoting a typical set of stationary infrastructure components and mobile stations, the term wireless communication system may from time to time be used to refer to individual system components particularly where such components include a grouping of features such as a transceiver or the like. Each of these terms denotes a device or system ordinarily associated with a service provider and/or a user and may include infrastructure components and/or a wireless mobile device that may be used with a public network or within a private network such as an enterprise network. Additional examples of wireless communication units include personal digital assistants, personal assignment pads, and other portable personal computers equipped for wireless operation, a cellular handset or device, or equivalents thereof provided such units are arranged and constructed in accordance with the principles and concepts discussed herein. It should further be noted that the present invention is directed to transmitters, transceivers, transmit power control units, and the like embodied in hardware, software, a combination of hardware and software, and/or integrated circuits (IC) such as a mixed signal IC in accordance with various exemplary and alternative exemplary embodiments discussed and described herein.

The present description is provided to further explain, in an enabling fashion, exemplary modes of performing one or more embodiments of the present invention. The description is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is understood that the use of relational terms such as first and second, and the like, if any, are used solely to distinguish one from another entity, item, or action without necessarily requiring or implying any actual such relationship or order between such entities, items or actions.

As noted, much of the inventive functionality and many of the inventive principles when implemented, are best supported with or in a mixed signal IC, or a combination of software and an IC, such as a digital signal processor and corresponding software or application specific ICs with programmable features. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the preferred embodiments.

In addition to transmit power control devices of a general nature, the communication devices of particular interest are those providing or facilitating transmit power control associated with, for example, voice/data communications services over cellular wide area networks (WANs), such as conventional two way systems and devices, various cellular phone systems including analog and digital cellular, CDMA (code division multiple access) and variants thereof, GSM, GPRS (General Packet Radio Service), 3G systems such as UMTS (Universal Mobile Telecommunication Service) systems, EDGE (Enhanced Data Rate for GSM) systems, Internet Protocol (IP) Wireless Wide Area Networks like 802.16, 802.20 or Flarion, integrated digital enhanced networks and variants or evolutions thereof. Furthermore the wireless communication units or devices of interest can have short range wireless communications capability normally referred to as WLAN capabilities, such as IEEE 802.11, Bluetooth, or Hiper-Lan and the like preferably using CDMA, frequency hopping, OFDM or TDMA access technologies.

Thus in accordance with various exemplary embodiments as will be further described below, an integrated circuit (IC), such as a mixed signal integrated circuit or the like, can be configured to facilitate transmit power control, such as closed loop power control involving a reference path, a detect path, and a power control path. The power control can include control between different power levels, e.g., a zero to non-zero level, non-zero to zero level, or first to second non-zero level, associated with a transmission such as a transmission of a composite transmit signal as will be appreciated by one of ordinary skill. It will also be appreciated that the different power levels can be associated with a transmit power level transition associated with, for example, a timeslot to timeslot transition, a channel to channel transition, a frequency to frequency transition, transmitter turn-on/warm-up or turn-off, or the like. Accordingly, the different power levels include a pre-transition power level and a post transition power level associated with a transmit power transition, for example as noted above.

An exemplary IC, as noted, can include a reference path configured to provide a reference signal and a gain compensation signal generated after a delay, a detect path configured to process a detected signal corresponding to a power level, in accordance with the gain compensation signal such as by applying an analog gain value, to provide a gain compensated detected signal such as a digital feedback signal converted from the detected signal including the analog gain value. The exemplary IC can further include a power control path configured to generate a power control value in accordance with the reference signal, the gain compensated detected signal, and a loop compensation factor associated with the gain compensation signal. The power control value can be used for setting the power level for the different power levels for the transmission.

Figure 1:
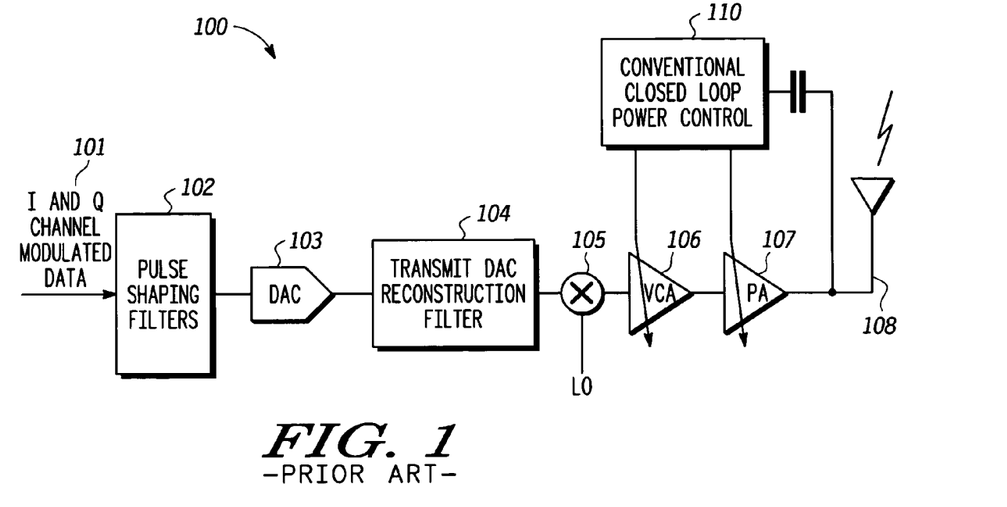
FIG. 1 is a diagram illustrating a conventional closed loop transmit power control configuration.

To better understand the principles of the invention, reference is made to conventional closed loop power control configuration 100, as shown in FIG. 1. An information signal 101 destined for transmission, can include I and Q channel modulated data. The information signal 101 is input to a pulse shaping filter 102, and to a digital to analog converter (DAC) 103 for analog conversion. The output of the DAC 103 is input to a transmit DAC reconstruction filter 104 to perform additional processing as will be appreciated by one of ordinary skill. The output of the transmit DAC reconstruction filter 104 is input to a mixer 105 where a Local Oscillator (LO) signal is multiplied therewith forming the transmission band signal which is input to a Voltage Controlled Amplifier (VCA) 106 and and/or a Power Amplifier (PA) 107 for ultimate control of the transmit power levels associated with the transmission of, for example, a composite slotted or other composite transmit signal, or associated transmit signal over a transmit or a transmit/receive antenna 108 during a transmit interval. It will be appreciated in the art that the principles discussed and described herein may further be applicable in transmit diversity environments, such as those systems where two or more transmit antennae are used to provide transmission and control of a composite transmit signal, A conventional closed loop power control block 110 can perform closed loop power control based on a power level obtained from a portion of the transmission band signal sampled through, for example, a power detector.

Figure 2:
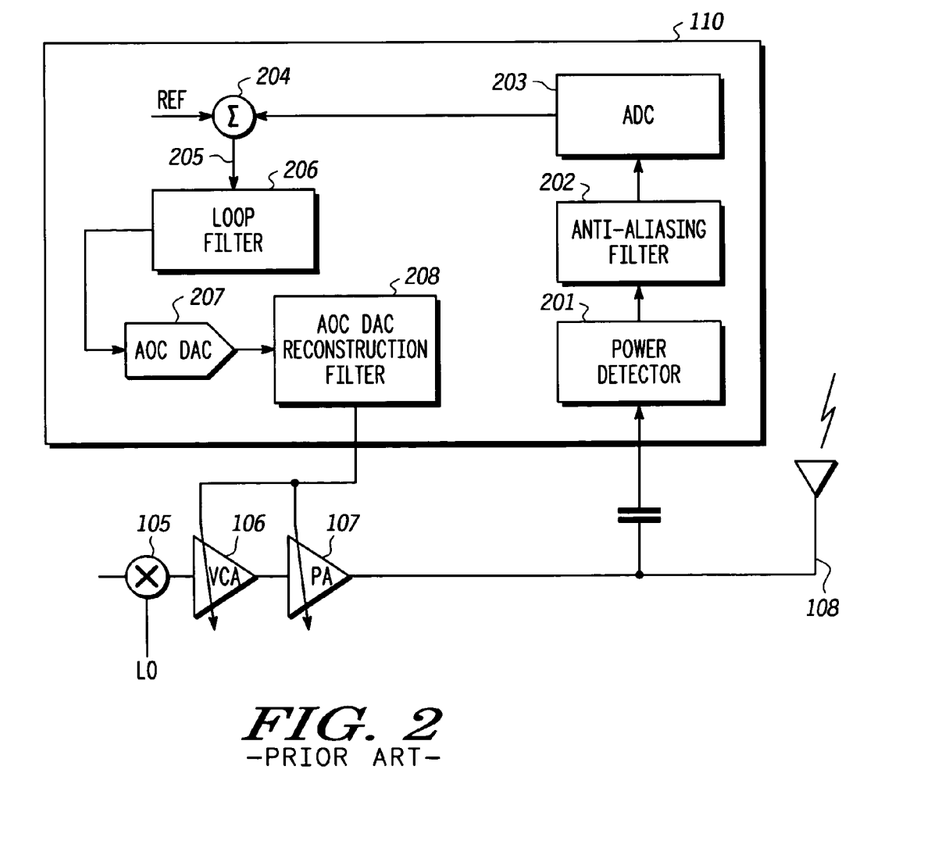
FIG. 2 is a diagram further illustrating the conventional closed loop power control configuration of FIG. 1.

The conventional closed loop power control block 110 is shown in greater detail in FIG. 2. The transmission band signal can be input to a power detector 201 and an anti-aliasing filter 202 for conditioning prior to input to an Analog to Digital Converter (ADC) 203. The ADC 203 generates a digital feedback signal sampled from the transmission band signal which is input to a summer or a subtractor 204. After combining the digital feedback signal with a reference signal, an error signal 205 is generated and input to a loop filter 206. The output of the loop filter 206 is input to the Automatic Output Controller (AOC) Digital to Analog Converter (DAC) 207 and to an AOC DAC reconstruction filter 208 which generates the actual power control signal which is then output to the VCA 106 and/or the PA 107 and used to control a power level at the antenna 108. It will be appreciated that various power levels need to be generated by the transmitter and amplified accordingly.

However limitations arise due to inadequate control provided by the conventional closed loop power control block 110. For example, the bandwidth of the loop filter 206 can be disturbed during power control level changes. Such disturbances can be caused by, for example, latency between the application of a new reference value and the generation of a corresponding feedback value due to for example, conversion delay in one or more paths associated with the control loop, and the like. Conventional power control systems further experience problems during slot-to-slot power transitions, such as for example, a transition from a previous power level to a new power level, which is required for multi-slot transmission as may be specified in systems such as GPRS transmit systems, EDGE transmit systems, WCDMA transmit systems, HSDPA transmit systems and the like. While some literature may describe changing detect path gain as a function of output power level, such descriptions fail to discuss how a detect path gain change can be achieved within a closed loop power control system while meeting the transmit system functional and performance goals and also maintaining constant loop gain bandwidth. In particular, the prior art fails to discuss functionality required in the reference signal path and in the control signal path to achieve a desired target power level while maintaining a constant loop bandwidth.

Figure 3:
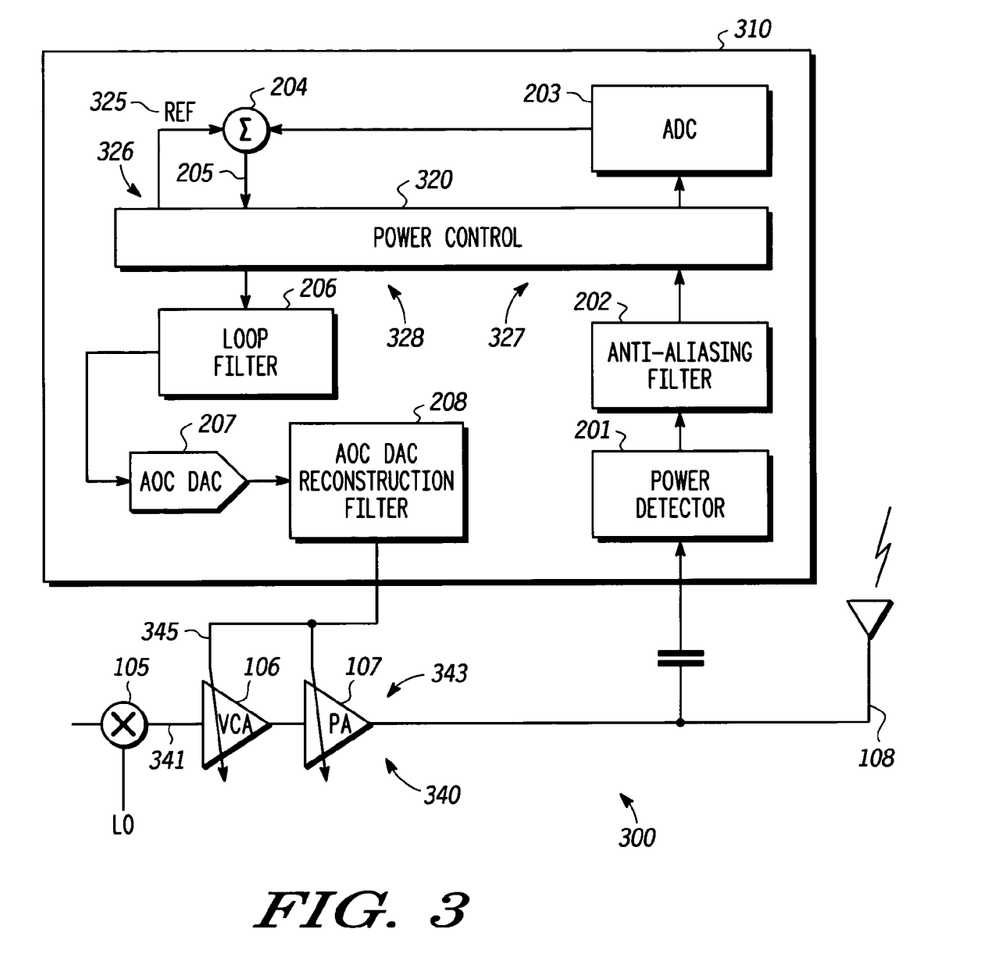
FIG. 3 is a diagram illustrating an exemplary transmitter system with a power control system exhibiting closed loop power control with high dynamic range in accordance with various exemplary embodiments.

Accordingly, a transmitter system 300 with a power control system 310 coupled to a transmitter amplifier 340 in accordance with various exemplary embodiments can be constructed/arranged as shown for example in FIG. 3. Much of the system 300, including the power control system or closed loop power control system 310 can be implemented in one or more integrated circuits, including mixed signal integrated circuits. The power control system can be used to maintain a constant loop gain and other advantages as will be described in greater detail hereinafter. A closed loop power control unit 320 which can be implemented in or as, for example, a mixed signal integrated circuit (IC), a processor executing software and analog circuitry, or the like, can modify an analog gain value in a detect path, for example prior to conversion in the ADC 203, and also generate a reference signal or value 325 in a reference path for use in the subtractor 204 (adder arranged to provide a difference) for generating the error signal 205. The closed loop power control block 320 can further include loop compensation for loop gain stabilization resulting in constant loop gain bandwidth during transitions from one to another power level.

Generally the transmitter system 300 of FIG. 3 or power control system 310 is configured to facilitate transmit power control between and at different power levels, such as power level 1 in slot 1, power level 2 in slot 2, etc., associated with a transmission from the transmitter amplifier 340. The transmitter amplifier 340 includes a signal input 341, a signal output 343, and a gain control input 345. Note that the signal output may be viewed as an output from the VCA 106 or power amplifier (PA) 107, where an output level or power level, for a given input at input 341 varies in accordance with a signal or value at the control input 345. The power control system 310 is coupled to the transmitter amplifier and configured to provide a gain control value that is coupled directly or indirectly to the gain control input.

The power control system as will be described in further detail below, comprises a reference signal generator 326 or path configured to provide a reference signal and in some embodiments a gain compensation signal. In some instances the reference generator utilizes a ramp profile corresponding to a transition between two power levels. In one or more embodiments the reference path or reference generator also provides a gain compensation signal. The system 310 also includes a detector path or detector 327 that is coupled to the signal output 343 of the transmitter amplifier and the reference signal generator and configured to provide a feedback signal corresponding to a signal or power level at the signal output 343. In some embodiments, the detect path is configured to process, in accordance with a gain compensation signal, a detected signal, e.g., corresponding to an output signal or power level from the transmitter amplifier, to provide a gain compensated detected signal at the subtractor (adder configured to take difference) 204. Further included is a power control path, control circuitry, or controller 328 that is coupled to the reference signal generator and feedback signal or gain compensated detected signal from the detector (by subtractor 204) and configured to provide a gain control value that corresponds to the reference signal and the feedback signal (as compensated in some embodiments). For example, the power control path may be configured to generate a power control value in accordance with the reference signal, the gain compensated signal, and a loop compensation factor associated with the gain compensation signal where the power control value is suitable for setting the power level for the transmission.

Figure 4:
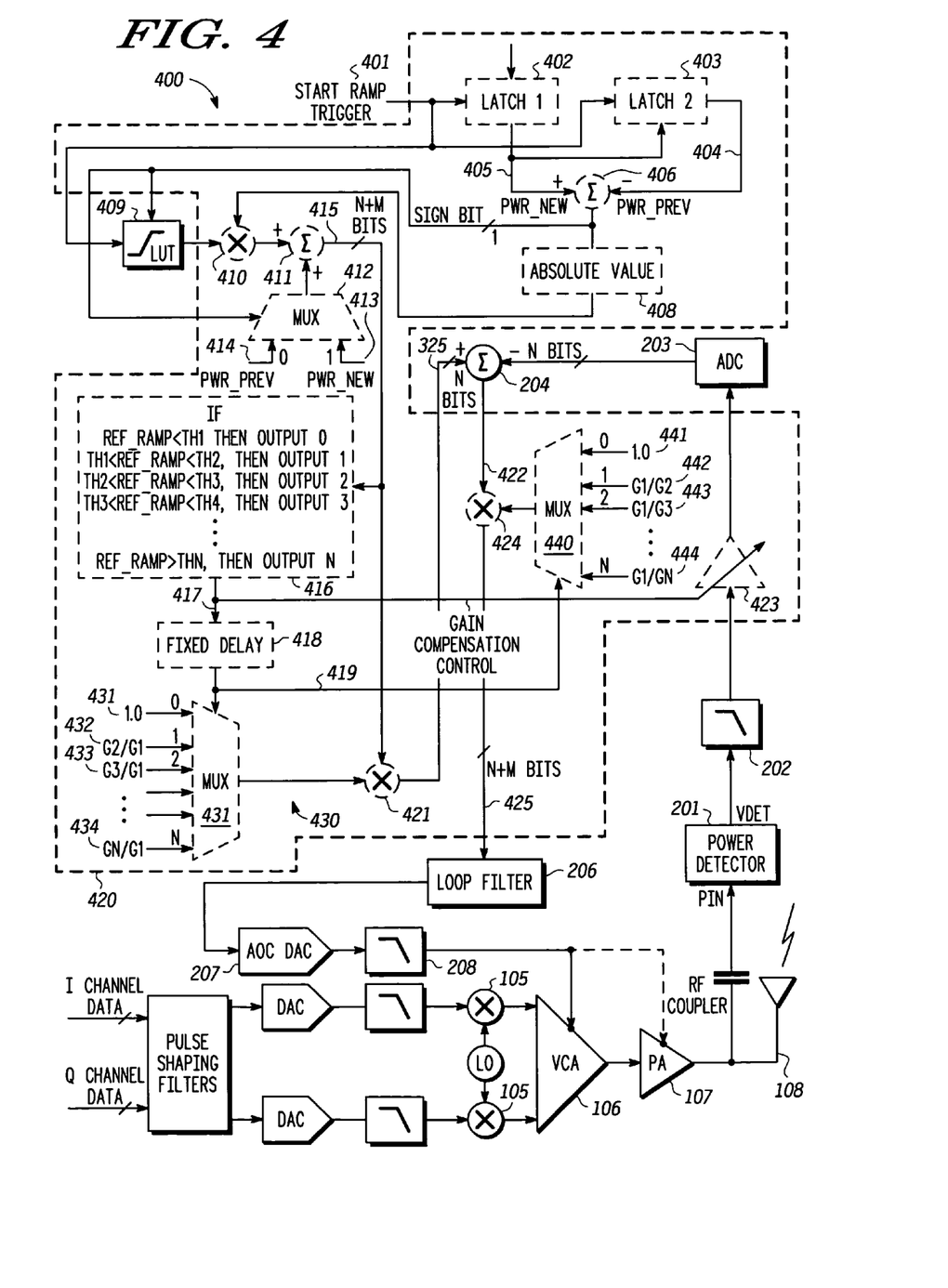
FIG. 4 is a more detailed diagram of the transmitter and power control system of FIG. 3 in accordance with various exemplary embodiments.

To better appreciate the transmitter system 300 with the closed loop power control system 310 and the closed loop power control unit 320 of FIG. 3, a detailed diagram is shown in FIG. 4, of one embodiment of a transmitter system 400 including a closed loop power control unit 420 (an embodiment of unit 320), which can, for illustrative purposes, represent portions of a mixed signal IC in accordance with various exemplary embodiments. Generally the functional blocks that provide the reference signal 325 may be viewed as the reference generator or path 326, the detector path 327 includes at least the portion of control unit 420 from the anti-aliasing filter 202 to the ADC 203, e.g., analog gain unit or controllable/variable gain amplifier 423 and may be viewed to include, as well, one or more of the power detector 201, filter 202, ADC 203, etc.

In some detail the reference path or reference generator is triggered by a Start Ramp trigger 401 that may be used to indicate a transition and precipitate the loading of, for example, a new target power level into a LATCH 1 402 and to store a value from a previous power setting (PWR_PREV) into a LATCH 2 403. The contents of the LATCH 1 402 and the LATCH 2 403 can be referred to as a PWR_NEW 405 and a PWR_PREV 404, which values may be input to a summer node 406 to generate a difference value including a magnitude and a sign bit 407. The absolute value of the difference is determined at 408. It will be appreciated that the sign bit 407 can provide an indication of the direction of power control needed for the transition and thus can be input to a reference ramp look up table (LUT) 409 and a ramp-up or ramp-down profile can be selected and provided from the LUT based on the sign bit 407 as initiated by the trigger 401. As further discussed below the reference ramp profile from the LUT can be scaled, e.g., multiplied by the magnitude of the power difference at multiplier 410 to form or provide an intermediate ramp signal. The sign bit 407 can also be input to a selector or a multiplexer 412 and used to determine whether to add, at adder 411, the PWR_NEW (e.g., sign bit is 1 413) or the PWR_PREV (e.g., sign bit is 0 414) to the value associated with the selected ramp-up or ramp-down profile, e.g. intermediate ramp signal to thereby generate or provide a ramp signal 415 that corresponds to the reference signal.

It will be appreciated that power control during a transition, e.g., from one power level to another, may occur over several successive cycles of the digital circuitry and thus the reference ramp values will contain, for example, a series of downward trending reference values which can be successively applied in the power control loop for the ramp-down profile or, conversely, a series of upward trending reference values which can be successively applied in the power control loop for the ramp-up profile. It will be appreciated that the ramp-up profile (from LUT) may contain values from 0 to 1 and the ramp down profile may contain values from 1 to 0. A mathematical description can be as follows. For a ramp up reference value generation: the ref_ramp (ramp signal 415)=LUT_output*abs [(the pwr_new 413)–(the pwr_prev 414)]+the pwr_prev 414, where LUT_output is a value from 0 to 1 given sign[(the pwr_new 413)–(the pwr_prev 414)]=0 (sign negative). Conversely, for a ramp down reference value generation: the ref_ramp 415=LUT_output*abs[(the pwr_new 413) –(the pwr_prev 414)]+the pwr_new 413, where LUT_output is a value from 1 to 0 given sign[(the pwr_new 413)–(the pwr_prev 414)]=1 (sign positive).

The reference values from the reference ramp LUT 409 can be multiplied at a multiplier 410 with the absolute value, magnitude, or the like associated with the difference 408 to form, for example, an intermediate reference value which can be added at a summing node 411 with the selected one of the pwr_new 413 and the pwr_prev 414 from the multiplexer 412 to generate a reference ramp value, e.g., ramp signal 415 which can be an N+M bit value, for example. For example the difference 408 can be an N bit value, but after multiplication with the reference value from the reference ramp LUT 409, the intermediate value can be an N+M bit value, for example, to provide greater mathematical precision for calculation, such as additions and multiplications within portions of the control loop.

The reference path or reference signal generator 326 in various embodiments further includes a comparison unit 416 that is coupled to the ramp signal 415 and configured to provide a gain compensation signal 417 that corresponds to an amplitude or value of the ramp signal. The comparison unit in essence is coupled to the ramp profile or scaled version thereof and arranged for providing the gain compensation signal in accordance with a range of the ramp profile. The ramp signal 415 can be input to the threshold comparison unit 416 where the value, e.g. amplitude, of the ramp signal can be continuously compared to a number of pre-programmed threshold levels such as TH1 . . . , THN. When a particular threshold level THi is crossed, a control signal or gain compensation signal 417 associated with, for example, an $i^{th}$ gain value is generated. It will be appreciated that the gain compensation signal may be used in one form or another to compensate or gain compensate the power control system. As depicted the detect path or detector 327 comprises the analog gain stage or unit 423 that is configured to apply an analog gain value to the detected signal which is arranged to drive the ADC converter 203. The ADC is configured to convert an output signal from the analog gain stage to a gain compensated detected signal, which is feedback signal corresponding to a signal level at the signal output of the transmitter amplifier. The analog gain unit has a gain or analog gain corresponding to the gain compensation signal, e.g., that is controlled or controllable by the gain compensation signal as provided by the reference signal generator to limit the amplitude range of a feedback signal.

For example, a crossing of a threshold level may indicate that a feedback gain, such as the gain at analog gain stage 423, needs to be altered based upon the present value of the ramp signal 415. The gain change can be necessary in order to accurately detect the power level of a signal output of the transmitter, e.g., the transmission band signal, while not over driving or under driving, for example, a feedback A/D stage, such as the ADC 203. The control signal or gain compensation signal 417 associated as noted with, for example, an $i^{th}$ gain value, can be used to select a detect path analog gain value of Gi among possible detect gains, such as linear gains, of G1, . . . , GN, where G1 reflects the lowest gain setting and GN indicates the highest gain setting.

Furthermore the gain compensation signal 417 or control signal can be applied or coupled to a delay unit 418 that is configured to provide a delayed compensation signal 419. The delay unit can have a predetermined or fixed delay corresponding, for example, to a delay in the detect path or detector, such as a conversion delay of the ADC 203. Thus the delayed compensation signal can be used or in fact is compensated for detect path delay, e.g. the delay of the ADC 203. The reference path or reference generator further comprises a gain compensator 430 further including, e.g., a multiplier 421 and multiplexer 431, that is coupled to the delayed compensation signal 419 and configured to apply gain compensation corresponding to the gain compensation signal, e.g., delayed compensation signal, to the ramp signal 415, e.g. ramp profile, to provide the reference signal 325. The ramp signal 415 is multiplied in a multiplier 421 by a selected gain compensation value of Gi/G1 from a selector or a multiplexer 430 when ever the detect path analog gain is changed to a gain value of Gi. The resulting gain compensation values as selected by the delayed compensation signal 419, such as a G1/G1 value 431 (1.0), a G2/G1 value 432, a G3/G1 value 433, a GN/G1 value 434 can be output to the multiplier 421 and used to scale the ramp signal to provide the reference signal. Thus the gain compensation signal as delayed or the delayed compensation signal controls the gain compensator to compensate for delay through the detect path, e.g., delay through the ADC 203.

As a review we have described a reference path or reference generator 326, that may be implemented, for example, in an integrated circuit, and provides a reference signal and in some embodiments a gain compensation signal. The reference path or generator includes, among others, a first register 402 configured to store a new transmit power level; a second register 403 configured to store a previous transmit power level; a difference node 406 configured to generate a difference between the new transmit power level and the previous transmit power level, the difference including a magnitude and a sign; a Look Up Table (LUT) 409 containing a plurality of reference ramp profiles; and a ramp generator (410–412) configured to generate a ramp signal corresponding to the reference signal, the ramp generator comprising a multiplier 410 for multiplying the magnitude of the difference with one of the plurality of reference ramp profile values obtained from the LUT 409 to provide an intermediate ramp signal and an adder 411 for adding the intermediate ramp signal to one of the new transmit power level and the previous transmit power level based on the sign as provided by multiplexer 412.

It should be noted that gain compensation is applied in a time aligned fashion, by virtue of the delay unit 418, to ensure that the same amount of gain change is applied to both the reference and detect paths. If compensation for the detect path gain change within the reference path was not performed, the closed loop power control system would traverse to the wrong target power level. Thus the delay compensation at the delay unit 418 is applied through a delayed compensation signal 419 at the multiplexer 431 in the reference path at a time to align with the arrival of the feedback signal or gain compensated detected signal at the subtractor 204. Thus any gain changes in the detect path and reference path are time aligned and this helps avoid any undesirable loop transients and the like. As will be discussed below, a loop compensation unit 440 and a multiplier 424 in the controller or control circuitry or control path is used to time align changes in that path and maintain a constant loop gain and loop bandwidth.

The reference generator will provide the reference signal 325, e.g., multiplier 421 will generate an N bit reference value, which can be input to a summing node, e.g. subtractor 204, along with an N bit digital feedback signal or gain compensated detected signal from the ADC 203. After computing the difference, such as the magnitude of the difference between the reference value and the feedback signal in the detect path, an error signal 422 is generated and provided to the control circuitry or power control path 328. The control circuitry or path includes a multiplier 424 and a loop compensation unit 440, e.g. a multiplexer, configured to apply gain compensation corresponding to the gain compensation signal in accordance with a delay through the detect path, e.g., ADC 203. The multiplier 424 is configured to generate the power control value or value corresponding to a gain control value by multiplying the error signal and a loop compensation factor, where as noted the error signal is derived from a difference between the reference signal and a gain compensated detected signal. The loop compensation unit is coupled to the delayed compensation signal 419 (corresponding to the gain compensation signal) and is configured to provide the loop compensation factor, where in one or more embodiments the loop compensation factor includes a reciprocal of a gain compensation factor associated with the gain compensation signal.

For example, the error signal 422 is further multiplied at a multiplier 424 by a loop compensation factor or value of G1/Gi. It will be appreciated that the loop compensation factor is the reciprocal of the detect path gain compensation value or analog gain value noted above. The loop compensation value includes a value G1/G1 441 (1), a value G1/G2 442, a value G1/G3 443, and a value G1/GN 444. The loop compensation ensures a constant loop bandwidth whenever the reference and detect path gain is changed to, for example, a value associated with Gi. If loop gain compensation is not applied, as in conventional closed loop power control systems, loop dynamics would be adversely affected including loop instability and inability to meet the desired Power versus Time mask desired at the output of the PA 107 for various target power levels. Since the loop compensation unit or multiplexer is driven from the delayed compensation signal changes in gain in the control path are time aligned with changes in gain of the reference path.

Thus the application of detect gain compensation within the reference path and loop gain compensation within the power control path, such as the error signal path, in a time aligned manner allows the N bit power control signal 425 to the loop filter 206 to remain unaffected when detect path gain changes are performed. As noted, the averaged power control signal at the output of the loop filter 206 is applied to a baseband, IF, or RF gain control stage after conversion of the digital control signal to analog format using the AOC DAC 207 and its reconstruction filter the AOC DAC reconstruction filter 208.

Thus a power control system suitable for implementation at least in part in an integrated circuit (IC) has been described and discussed. The system in one or more embodiments includes the detect path 327 comprising a variable gain amplifier 423 driving an analog to digital converter 203 and having a gain corresponding to a gain compensation signal 417. Further included is a reference path 326 including a delay unit 418 coupled a gain compensator 430 collectively configured to provide, for a reference signal 325, gain compensation corresponding to the gain compensation signal and delay compensation corresponding to a time delay associated with the detect path. Also included is a power control path 328 including a loop compensation unit 440 configured to apply a loop compensation factor to an error signal 422 via multiplier 424 to provide a power control value, the error signal corresponding to the reference signal and a gain compensated detected signal from the detect path, the loop compensation factor accounting for the time delay and being inversely proportional to the gain compensation for the reference signal. In many embodiments the integrated circuit can further include a portion or all of a transmitter amplifier 106, 107 having a gain controlled in accordance with the power control value and configured to provide an output signal corresponding to a detected signal. The power control system or IC is particularly configured to facilitate power control during a transmit power transition between different power levels, the transmit power transition including one of a channel-to-channel transition, a timeslot-to-timeslot transition, and a frequency-to-frequency transition.

Figure 5:
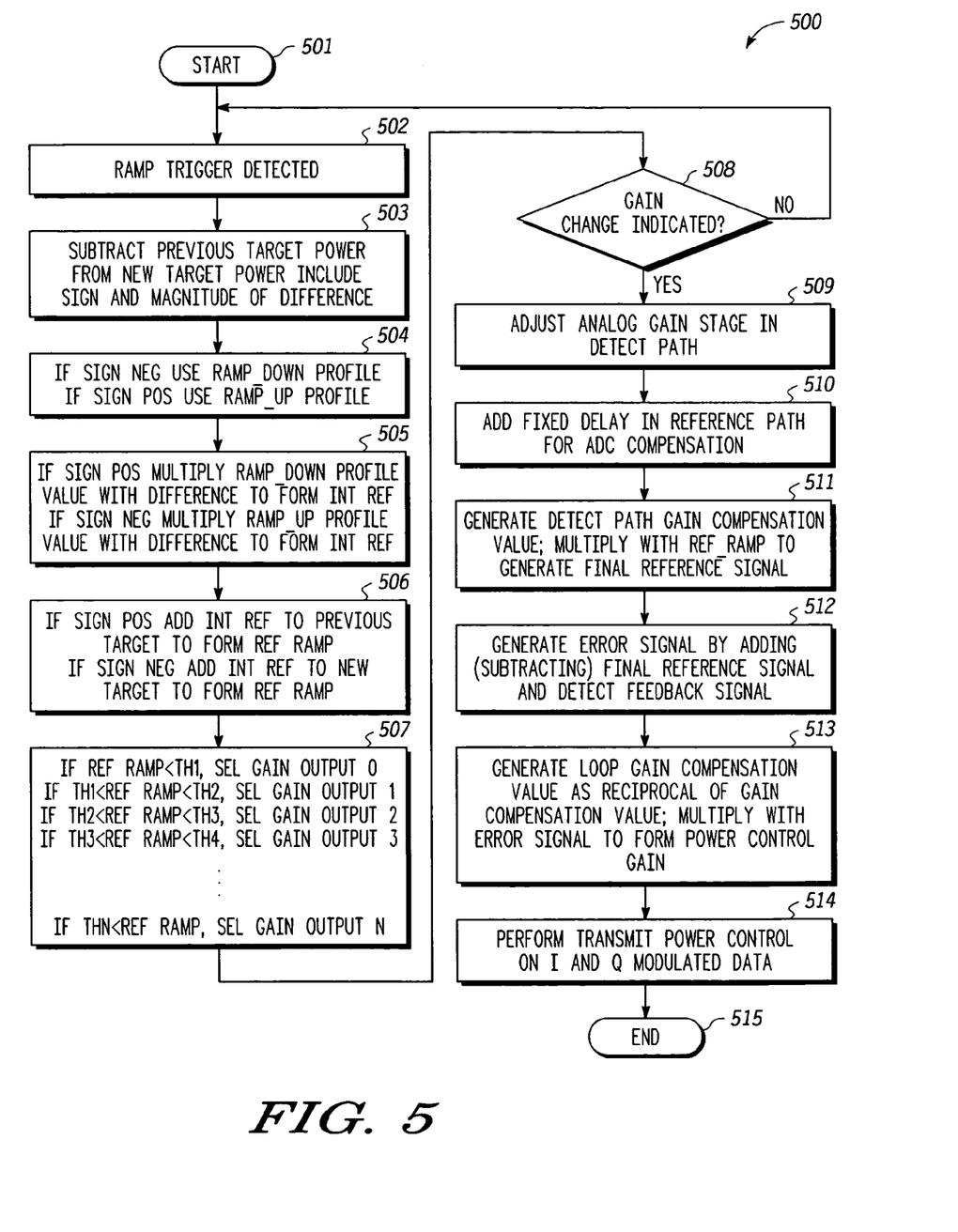
FIG. 5 is a flow chart illustrating an exemplary procedure in accordance with various exemplary embodiments.

It will be appreciated that principles and concepts discussed and described herein in accordance with various exemplary embodiments can be embodied in an exemplary method or procedure 500, as illustrated in FIG. 5. This method is suitable for performing using the apparatus described above or other suitably configured arrangements. After starting at 501 which could be initialization of hardware, software reset, or a new power level, or the like, a ramp trigger can be detected at 502. The previous power level can be subtracted from the new power level at 503 including a sign and a magnitude of the difference. Based on the sign of the difference, a RAMP_DOWN or a RAMP_UP profile can be used at 504 for reference ramp values of between 0 and 1 for RAMP_UP and 1 and 0 for RAMP_DOWN as previously noted. At 505, if the sign value associated with the difference is negative, the RAMP_DOWN profile value can be multiplied with the magnitude of the difference to form an intermediate reference value and if the sign value is positive, the RAMP_UP profile value can be multiplied with the magnitude of the difference to form the intermediate reference value. At 506, if the sign value is positive, the intermediate reference value is added to the previous target power level to form the reference ramp value, such as the ref_ramp 415, and if the sign value is negative, the intermediate reference value is added to the new target power level to form the reference ramp value. At 507, the reference ramp value can be compared to a series of threshold values as described hereinabove in order to determine an analog gain value to be applied in the detect path. If a gain change is indicated at 508, the analog gain can be adjusted in the detect path at 509. If no gain change is indicated at 508, then the exemplary procedure can simply return to wait for the next ramp trigger event, for example at 502.

At 510, after adjusting the analog gain at 509, a fixed delay can be added in the reference path processing to compensate for conversion delay in the detect path as noted hereinabove. At 511, after the delay, a detect path gain compensation value can be generated and multiplied with the ref_ramp value to form a final reference signal. At 512, an Error Signal can be generated by adding the final reference signal to a negative version of a detect feedback signal (i.e., subtracting the two signals). At 513, a loop gain compensation value can be generated such as a reciprocal of the detect path gain compensation value and multiplied with the Error Signal to form a stabilized power control signal. At 514 the power control signal can be used to perform transmit power control, for example on I and Q modulated data. At 515, the exemplary procedure can end, although one of ordinary skill in the art will appreciate that the procedure can also return to start 501, and wait, for example, for a new ramp trigger or the like.

Thus the method 500 is for facilitating transmit power control between different power levels associated with a transmission. The method comprises generating a gain compensation value corresponding to a reference signal 507 in a reference path of a power control loop where the power control loop further includes a detect path and a power control path; changing a gain applied to a detected signal 509 in the detect path based on the gain compensation value to provide a gain compensated detected signal; and providing a power control value or gain 513 in accordance with the reference signal, the gain compensated detected signal, and a loop compensation factor corresponding to the gain compensation value, where the power control value is suitable for setting the power level for the transmission. The generating the gain compensation value 507 further comprises comparing a ramp signal to one or more thresholds and selecting a gain compensation value based on the comparing. The reference signal is generated from one of a ramp up profile and a ramp down profile obtained from a Look Up Table (LUT) containing a plurality of reference ramp profile values. Generating the reference signal further comprises compensating a ramp signal for delay in the detect path 510 and according to the gain compensation value 511.

Figure 6:
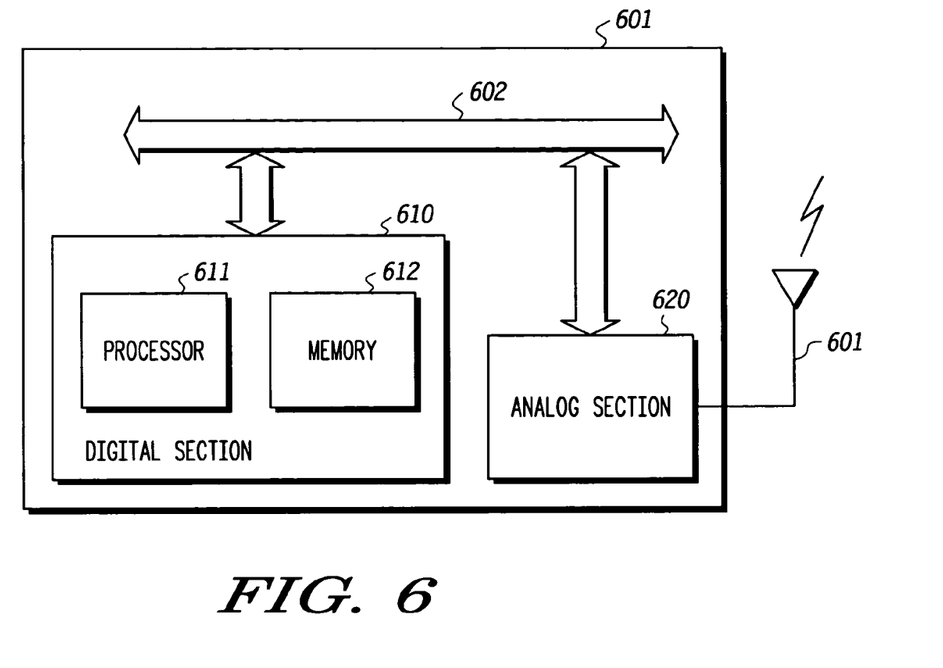
FIG. 6 is a block diagram illustrating an exemplary apparatus in accordance with various exemplary and alternative exemplary embodiments.

In accordance with various exemplary and alternative exemplary embodiments, for example, as described hereinabove, the present invention can be implemented using an exemplary apparatus 601 as shown in FIG. 6. The exemplary apparatus 601 which can be for example, an apparatus located in a transmitter, transceiver, transmit power control unit, or the like, includes a digital section 610 which can be coupled to a bus 602, and an analog section 620 which can also be coupled to the bus 602. It will be appreciated that the bus 602 can illustrate both a digital bus as is common and also may include analog control signals or the like such that analog control may be achieved through, for example, a digital interface to an analog section 620 or may be directly achieved through analog or quasi analog control signals to the analog section 620, such as a digital control line which selects an analog gain value to be applied in the analog gain stage as described herein above. It will further be appreciated that the digital section 610 can further include a processor 611 and a memory 612 which while not shown for simplicity may be connected to each other and to the bus 602 including analog or quasi analog control signal lines, as is well understood. It will be appreciated that the processor 611 may be a general purpose processor dedicated to performing closed loop power control related procedures as described herein or can be a dedicated processor specifically configured to perform closed loop power control related tasks. The analog section 620 may further be configured with a transmitter or transceiver/RF interface coupled to one or more antenna or antennae 601, such as multiple antennae 601 for transmit diversity transmitter and transceivers, and can include the analog component(s) shown for example in FIG. 3 and FIG. 4, or the like.

Figure 7:
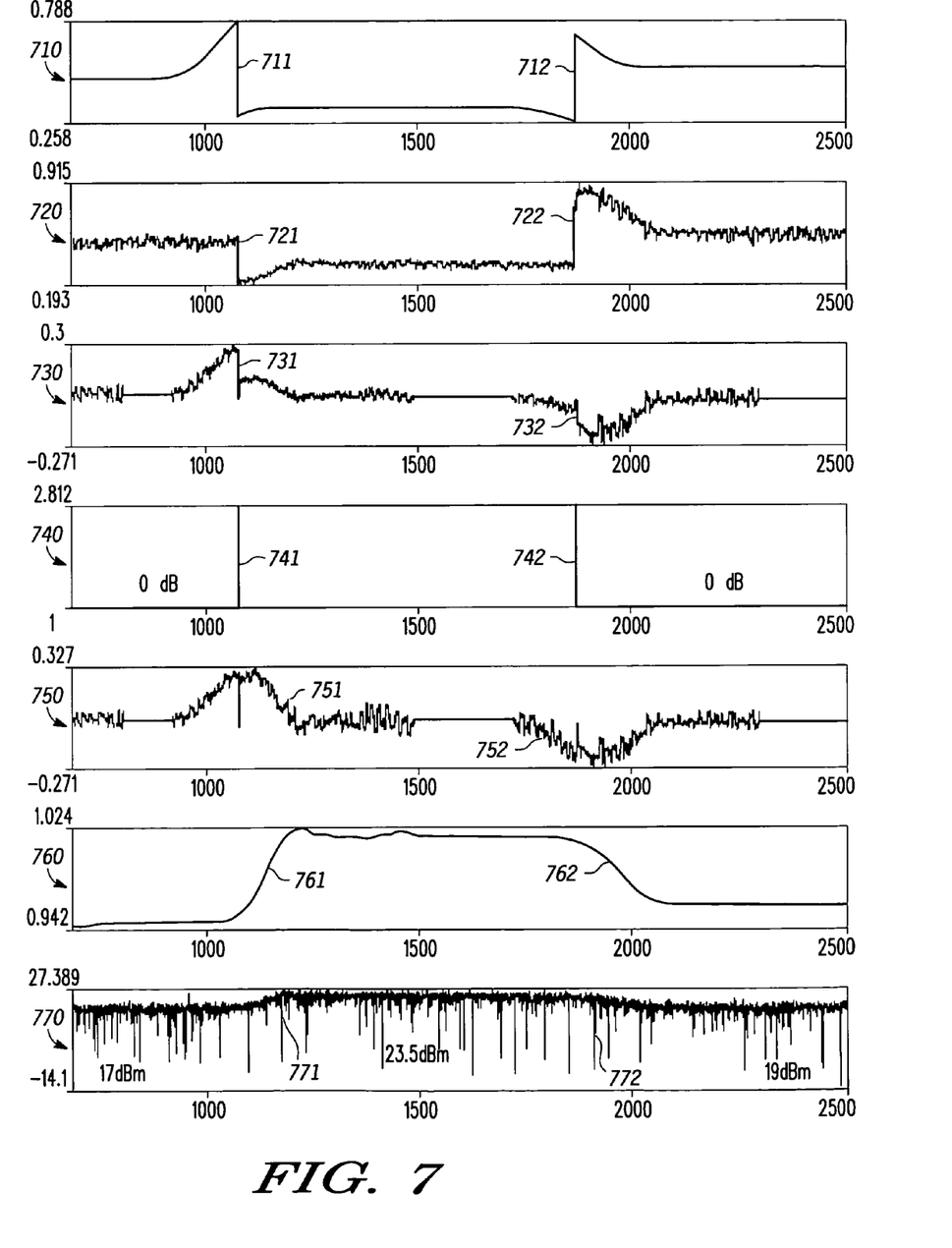
FIG. 7 is a diagram illustrating a series of exemplary simulation results obtained in accordance with various exemplary embodiments.

To fully appreciate the advantageous and unexpected results of power control in accordance with various exemplary embodiments, a series of simulation results are illustrated in FIG. 7 in the form of a detect gain compensation graph 710 in the reference path, a detect gain change graph 720 in the detect path, a error signal graph 730 before gain compensation, a 0 dB to 9 dB gain change graph 740, a error signal graph 750 after gain compensation, a voltage control graph 760, and an antenna power graph 770. In the detect gain compensation graph 710, a first transition point 711 and a second transition point 712 are shown in the reference path. In the detect gain change graph 720, a first gain change detection point 721 and a second gain change detection point 722 are shown in the detect path. It will be appreciated that in the detect gain compensation graph 710 and the detect gain change graph 720, such as during the ramp up process at the first transition points 711 and 721, when a programmed threshold level is crossed, the reference and detect path gains are dynamically reduced by 9 dB in a time aligned fashion. Similarly, the reference and detect path gains are dynamically increased by 9 dB at the second transition points 712 and 722 during the ramp down process.

In the error signal graph 730, a first error signal transition point 731 and a second error signal transition point 732 are shown before gain compensation and include severe discontinuities that can cause loop bandwidth instability as noted herein above. The 0 dB to 9 dB gain change graph 740 shows a first exemplary power level transition 741 and a second exemplary power level transition 742 representing a reduction in the detect path gain by 9 dB during the ramp up and an increase by 9 dB during the ramp down to avoid overdriving and under-driving respectively a feedback A/D stage. The error signal graph 750 shows a first error signal transition point 751 and a second error signal transition point 752 after gain compensation and include a more gradual ramping so as to maintain a constant loop gain bandwidth. Thus to avoid altering the loop bandwidth, the error signal is scaled by +9 dB during the ramp up process and scaled by −9 dB during the ramp down process.

The resulting stabilized power control is reflected in the voltage control graph 760, and the antenna power graph 770 which show levels that will easily meet transmission specifications. The above mentioned resulting ramp up and ramp down power control response shown for example in the antenna power graph 770, allows a transmitter, transceiver or the like equipped with a power control system or unit operating in accordance with various exemplary embodiments to meet desired Power versus Time requirements without undesirable transient performance issues.

Figure 8:
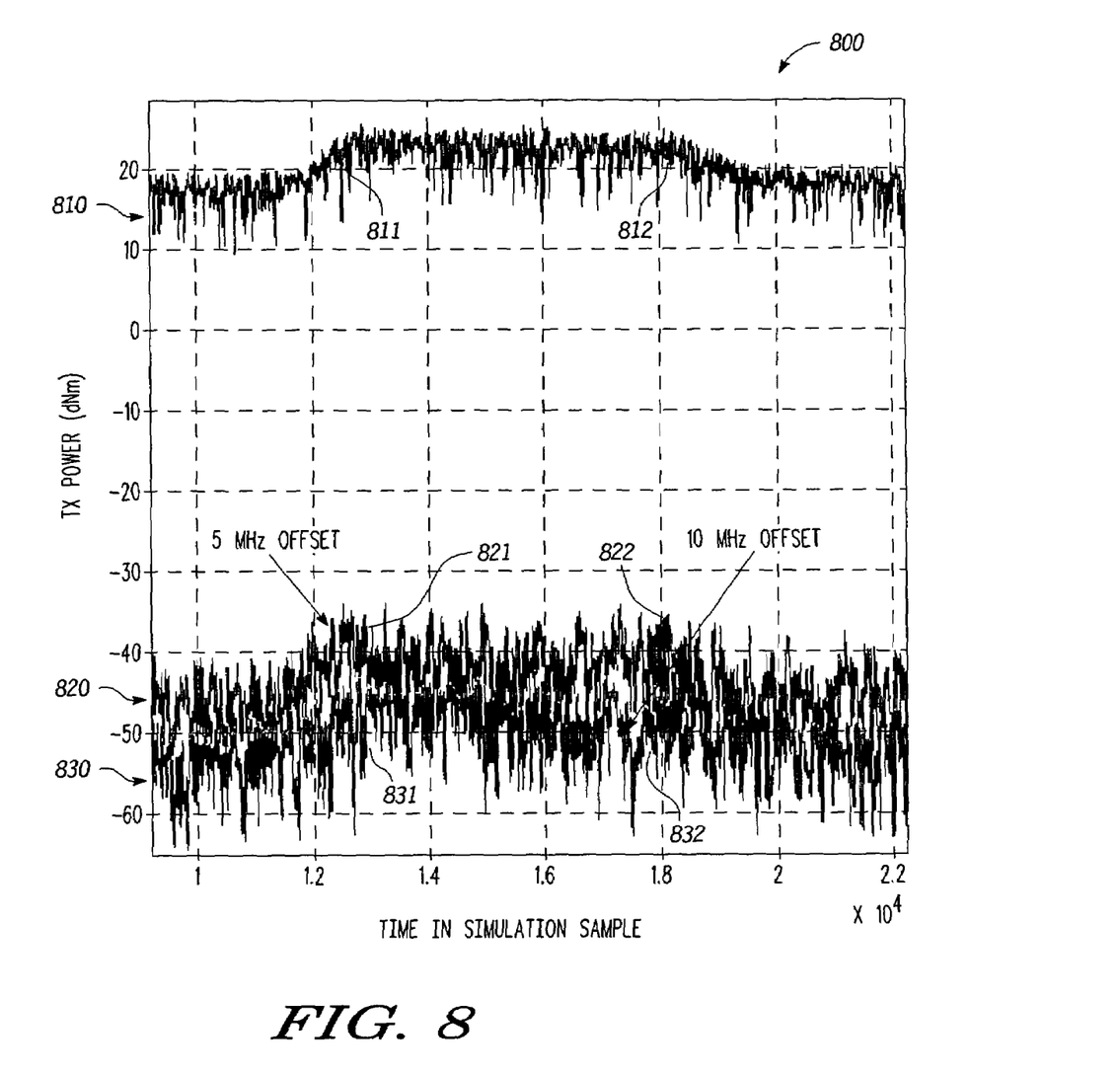
FIG. 8 is a graph illustrating various power levels during an exemplary transition in accordance with various exemplary and alternative exemplary embodiments.

Still further, as illustrated in FIG. 8, a graph 800 shows transmit power level versus time for an on-channel signal 810 and a first transition point 811 and a second transition point 812. The graph 800 also shows transmit power versus time for an adjacent channel 820 and an alternate channel 830, for example during the ramp up and ramp down transitions of FIG. 7. The graph 800 shows that the transient Adjacent Channel Leakage Ratio (ACLR) meets performance requirements of 33 dB ACLR for the adjacent channel and 43 dB ACLR for the alternate channel typically associated with, for example, WCDMA requirements.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. Many such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit (IC) configured to facilitate transmit power control during and between different power levels associated with a transmission, the IC comprising:
    a reference path configured to provide a reference signal and a gain compensation signal;
    a detect path configured to process, in accordance with the gain compensation signal, a detected signal corresponding to a power level to provide a gain compensated detected signal; and
    a power control path configured to generate a power control value in accordance with the reference signal, the gain compensated detected signal, and a loop compensation factor associated with the gain compensation signal, the power control value suitable for setting the power level for the transmission.

2. An integrated circuit (IC) in accordance with claim 1, wherein the reference path further comprises:
    a delay unit, coupled to the gain compensation signal, configured to provide a delayed compensation signal; and
    a gain compensator, coupled to the delayed compensation signal, and configured to apply gain compensation to a ramp signal to provide the reference signal.

3. An integrated circuit (IC) in accordance with claim 2, wherein the reference path further comprises a comparison unit coupled to the ramp signal and configured to provide the gain compensation signal, the gain compensation signal corresponding to an amplitude of the ramp signal.

4. An integrated circuit (IC) in accordance with claim 1, wherein the reference path further includes:
    a first register configured to store a new transmit power level;
    a second register configured to store a previous transmit power level;
    a difference node configured to generate a difference between the new transmit power level and the previous transmit power level, the difference including a magnitude and a sign;
    a Look Up Table (LUT) containing a plurality of reference ramp profiles; and
    a ramp generator configured to generate a ramp signal corresponding to the reference signal, the ramp generator comprising a multiplier for multiplying the magnitude of the difference with one of the plurality of reference ramp profile values obtained from the LUT to provide an intermediate ramp signal and an adder for adding the intermediate ramp signal to one of the new transmit power level and the previous transmit power level based on the sign.

5. An integrated circuit (IC) in accordance with claim 1, wherein the detect path further comprises an analog gain stage configured to apply an analog gain value to the detected signal, the analog gain value corresponding to the gain compensation signal.

6. An integrated circuit (IC) in accordance with claim 5, wherein the detect path further includes an Analog to Digital Converter configured to convert an output signal from the analog gain stage to the gain compensated detected signal.

7. An integrated circuit (IC) in accordance with claim 1, wherein the power control path further comprises a multiplier configured to generate the power control value by multiplying an error signal and the loop compensation factor, the error signal derived from a difference between the reference signal and gain compensated detected signal.

8. An integrated circuit (IC) in accordance with claim 7, wherein the power control path further comprises a loop compensation unit coupled to a delayed compensation signal corresponding to the gain compensation signal and configured to provide the loop compensation factor, the loop compensation factor including a reciprocal of a gain compensation factor associated with the gain compensation signal.

9. An integrated circuit (IC) in accordance with claim 1, wherein:
    the detect path includes a variable gain amplifier driving an analog to digital converter and having a gain corresponding to the gain compensation signal;
    the reference path includes a delay unit coupled a gain compensator collectively configured to provide, for the reference signal, gain compensation corresponding to the gain compensation signal and delay compensation corresponding to a time delay associated with the detect path; and
    the power control path includes a loop compensation unit configured to apply the loop compensation factor to an error signal to provide the power control value, the error signal corresponding to the reference signal and the gain compensated detected signal, the loop compensation factor accounting for the time delay and being inversely proportional to the gain compensation for the reference signal.

10. An integrated circuit (IC) in accordance with claim 1, further comprising a transmit amplifier with a gain controlled in accordance with the power control value and configured to provide an output signal corresponding to the detected signal.

11. An integrated circuit (IC) in accordance with claim 1, configured to facilitate power control during a transmit power transition between the different power levels, the transmit power transition including one of a channel-to-channel transition, a timeslot-to-timeslot transition, and a frequency-to-frequency transition.

12. A method for facilitating transmit power control between different power levels associated with a transmission, the method comprising:

generating a gain compensation value corresponding to a reference signal in a reference path of a power control loop, the power control loop further including a detect path and a power control path;

changing a gain applied to a detected signal in the detect path based on the gain compensation value to provide a gain compensated detected signal; and providing a power control value in accordance with the reference signal, the gain compensated detected signal, and a loop compensation factor corresponding to the gain compensation value, the power control value suitable for setting the power level for the transmission.

13. A method in accordance with claim 12, wherein generating the gain compensation value further comprises comparing a ramp signal to one or more thresholds and selecting a gain compensation value based on the comparing.

14. A method in accordance with claim 12, further comprising generating the reference signal from one of a ramp up profile and a ramp down profile obtained from a Look Up Table (LUT) containing a plurality of reference ramp profile values.

15. A method in accordance with claim 14, wherein the generating the reference signal further comprises compensating a signal for delay in the detect path and according to the gain compensation value.

16. A transmitter system for facilitating power control during a transition from a first power level to a second power level, the transmitter system comprising:

a transmitter amplifier, having a signal input, a signal output, and a gain control input; and a power control system coupled to the transmitter amplifier and configured to provide a gain control value coupled to the gain control input, the power control system comprising:

a reference signal generator configured to provide a reference signal using a ramp profile corresponding to the transition from the first power level to the second power level;

a detector coupled to the signal output of the transmitter amplifier and the reference signal generator, the detector configured to provide a feedback signal corresponding to a signal level at the signal output; and control circuitry, coupled to the reference signal generator and the feedback signal from the detector, the control circuitry configured to provide the gain control value, the gain control value corresponding to the reference signal and the feedback signal.

17. A transmitter system in accordance with claim 16, wherein the detector further comprises an analog gain unit arranged to drive an analog to digital converter to provide the feedback signal, the analog gain unit having a gain that is controlled by a gain compensation signal provided by the reference signal generator, the gain controlled to limit the amplitude range of the feedback signal.

18. A transmitter system in accordance with claim 17, wherein the reference signal generator further comprises a comparison unit coupled to the ramp profile for providing the gain compensation signal according to a range of the ramp profile and a gain compensator for applying gain compensation to the ramp profile to provide the reference signal.

19. A transmitter system in accordance with claim 18, wherein the reference signal generator further comprises a delay unit coupled to the gain compensation signal to control the gain compensator to compensate for delay through the analog to digital converter.

20. A transmitter system in accordance with claim 17, wherein the control circuitry further comprises a loop compensation unit configured to apply gain compensation corresponding to the gain compensation signal in accordance with a delay through the analog to digital converter.

* * * * *

UNITED STATES PATENT AND TRADEMARK OFFICE
CERTIFICATE OF CORRECTION

| | | |
|---|---|---|
| PATENT NO. | : 7,148,749 B2 | Page 1 of 1 |
| APPLICATION NO. | : 11/046910 | |
| DATED | : December 12, 2006 | |
| INVENTOR(S) | : Mahibur Rahman | |

It is certified that error appears in the above-identified patent and that said Letters Patent is hereby corrected as shown below:

In Column 14, Line 40, Claim No. 9:

Change "the reference path includes a delay unit coupled a gain" to --the reference path includes a delay unit coupled to a gain--

Signed and Sealed this

Twenty-fourth Day of June, 2008

JON W. DUDAS
*Director of the United States Patent and Trademark Office*